(12) United States Patent
Tagashira

(10) Patent No.: US 10,965,059 B2
(45) Date of Patent: Mar. 30, 2021

(54) ELECTRONIC DEVICE AND ROBOT CONTROLLER

(71) Applicant: KAWASAKI JUKOGYO KABUSHIKI KAISHA, Kobe (JP)

(72) Inventor: Tsuyoshi Tagashira, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/489,094

(22) PCT Filed: Feb. 27, 2018

(86) PCT No.: PCT/JP2018/007140
§ 371 (c)(1),
(2) Date: Aug. 27, 2019

(87) PCT Pub. No.: WO2018/155702
PCT Pub. Date: Aug. 30, 2018

(65) Prior Publication Data
US 2020/0076124 A1 Mar. 5, 2020

(30) Foreign Application Priority Data
Feb. 27, 2017 (JP) .............................. JP2017-035060

(51) Int. Cl.
*H01R 12/00* (2006.01)
*H01R 13/629* (2006.01)
(Continued)

(52) U.S. Cl.
CPC .......... *H01R 13/629* (2013.01); *B25J 9/0009* (2013.01); *H01R 12/716* (2013.01);
(Continued)

(58) Field of Classification Search
CPC .. H01R 12/716; H01R 12/737; H01R 13/621; H01R 13/629; H02K 11/30;
(Continued)

(56) References Cited

U.S. PATENT DOCUMENTS 4,546,414 A * 10/1985 Donges ................ H05K 7/1455
361/736
4,620,362 A * 11/1986 Reynolds ................. B25J 15/04
483/9

(Continued)

FOREIGN PATENT DOCUMENTS

| JP | 2005-150161 A | 6/2005 |
|---|---|---|
| JP | 2011-134868 A | 7/2011 |
| JP | 2015-157154 A | 9/2015 |

*Primary Examiner* — Khiem M Nguyen
(74) *Attorney, Agent, or Firm* — Oliff PLC

(57) ABSTRACT

An electronic device includes: a first board configured as a printed circuit board having an electronic circuit component mounted thereon; a second board configured as a printed circuit board having an electronic circuit component mounted thereon; a board-to-board connector configured to electrically connect the first board and the second board, the board-to-board connector including a first terminal on the first board and a second terminal on the second board, the second terminal being configured to be connected to the first terminal; and a grip member on the second board.

9 Claims, 4 Drawing Sheets

(51) Int. Cl.
*H02K 11/30* (2016.01)
*B25J 9/00* (2006.01)
*H01R 12/71* (2011.01)
*H01R 12/73* (2011.01)
*H01R 13/621* (2006.01)
*H05K 1/18* (2006.01)

(52) U.S. Cl.
CPC ......... *H01R 12/737* (2013.01); *H01R 13/621* (2013.01); *H02K 11/30* (2016.01); *H05K 1/18* (2013.01); *H02K 2211/03* (2013.01); *H05K 2201/10189* (2013.01); *H05K 2201/10545* (2013.01); *H05K 2201/2036* (2013.01)

(58) Field of Classification Search
CPC ................. H02K 2211/03; H05K 1/18; H05K 2201/10189; H05K 2201/10545; H05K 2201/2036; B25J 9/0009
USPC ...................................................... 439/66, 74
See application file for complete search history.

(56) References Cited

U.S. PATENT DOCUMENTS

| | | | | |
|---|---|---|---|---|
| 5,205,701 A | * | 4/1993 | Kigami | ................. B25J 9/0009 285/305 |
| 5,425,133 A | * | 6/1995 | Yasuhara | ............... B25J 9/1612 318/568.21 |
| 2016/0266620 A1 | | 9/2016 | Top et al. | |

* cited by examiner

ELECTRONIC DEVICE AND ROBOT CONTROLLER

TECHNICAL FIELD

The present invention relates to an electronic device and a robot controller.

BACKGROUND ART

A printed wiring board connection structure has been conventionally known (see Patent Literature 1, for example).

The printed wiring board connection structure includes an interboard connector that connects together a plurality of boards disposed parallel to one another. With this feature, the printed wiring board connection structure can be compactly constructed.

CITATION LIST

Patent Literature

Patent Literature 1: Japanese Laid-Open Patent Application Publication No. 2005-150161

SUMMARY OF INVENTION

Technical Problem

However, the printed wiring board connection structure described in Patent Literature 1 has a problem in that the boards may be bent and damaged when the boards are pushed downward to make a connection via the interboard connector or lifted upward to break the connection.

Solution to Problem

In order to solve the above problem, an electronic device according to an aspect of the present invention includes: a first board configured as a printed circuit board having an electronic circuit component mounted thereon; a second board configured as a printed circuit board having an electronic circuit component mounted thereon; a board-to-board connector configured to electrically connect the first board and the second board, the board-to-board connector including a first terminal provided on the first board and a second terminal provided on the second board, the second terminal being configured to be connected to the first terminal; and a grip member provided on the second board.

With this configuration, the operation of making a connection between the first terminal and the second terminal and the operation of breaking the connection can be carried out while gripping the grip member. This can prevent damage to the boards during the operations.

The second board may be stacked to the first board, the first terminal may be provided on a front side of the first board, the second terminal may be provided on a back side of the second board, and the grip member may be provided on a front side of the second board.

With this configuration, the operation of assembling the boards can be accomplished by stacking the boards. This facilitates the operation of assembling the boards and offers an advantage, for example, in automating the assembly operation by means of a robot.

One of the first and second terminals of the board-to-board connector may be a male terminal having an electrical contact portion extending in a direction in which the first and second boards are stacked, and the other of the first and second terminals may be a female terminal having an electrical contact portion configured to receive the male terminal fitted therein and make contact with the electrical contact portion of the male terminal.

With this configuration, the connection via the board-to-board connector can easily be made and broken.

The grip member, as viewed in a direction of a normal to the first board, may extend through a region in which the board-to-board connector is located.

With this configuration, the force applied by pushing the grip member downward can be efficiently transmitted as a force acting to insert either one of the first and second terminals into the other when the connection via the board-to-board connector is made. Further, when the connection via the board-to-board connector is broken, the force applied by pulling the grip member upward can be efficiently transmitted as a force acting to withdraw either one of the first and second terminals from the other.

The electronic device may further include a spacer disposed on and extending from either the front side of the first board or the back side of the second board, the spacer having a length such that when the first terminal and the second terminal are connected, one end of the spacer is in contact with the front side of the first board and the other end of the spacer is in contact with the back side of the second board.

With this configuration, the depth of insertion of either one of the first and second terminals into the other can be defined by the spacer when the connection via the board-to-board connector is made. This can prevent the board-to-board connector from being damaged by an excessive force applied to the board-to-board connector.

The electronic device may include a pair of the spacers.

With this configuration, the depth of insertion of either one of the first and second terminals into the other can be appropriately defined by the spacers when the connection via the board-to-board connector is made.

The pair of spacers may be provided on the first board, and the second board has a pair of through holes at locations where the other ends of the pair of spacers make contact with the second board.

With this configuration, when the connection via the board-to-board connector is made, the second board can be accurately positioned relative to the first board by making an adjustment such that the through holes and the spaces are coaxially arranged.

A female thread may be formed in the other end of each of the spacers, and the electronic device may further include a pair of male screws inserted through the pair of through holes and screwed into the female threads of the pair of spacers.

With this configuration, the second board can be appropriately fixed to the first board with the aid of the spacers for defining the depth of insertion, and thus the construction of the electronic device can be simplified.

The electronic device may further include a housing having an opening, the opening may have a size that allows placement of the first and second boards into the housing through the opening, and the opening may be located outward of the front side of the second board.

With this configuration, the first and second boards can be joined to the housing through the opening.

In order to solve the above problem, a robot controller according to an aspect of the present invention includes: a first board configured as a printed circuit board having an electronic circuit component mounted thereon; a second board configured as a printed circuit board having an electronic circuit component mounted thereon; a board-to-board connector configured to electrically connect the first board and the second board, the board-to-board connector including a first terminal provided on the first board and a second terminal provided on the second board, the second terminal being configured to be connected to the first terminal; and a grip member provided on the second board.

With this configuration, the operation of making a connection between the first terminal and the second terminal and the operation of breaking the connection can be carried out while gripping the grip member. This can prevent damage to the boards during the operations.

Advantageous Effects of Invention

The present invention offers the advantage of making it possible to prevent damage to boards during operations.

DESCRIPTION OF EMBODIMENTS

Hereinafter, embodiments of the present invention will be described with reference to the drawings. The present invention is not limited by the described embodiments. In the following description, the same or equivalent elements are denoted by the same reference signs throughout the drawings and will not be repeatedly described.

Figure 1:
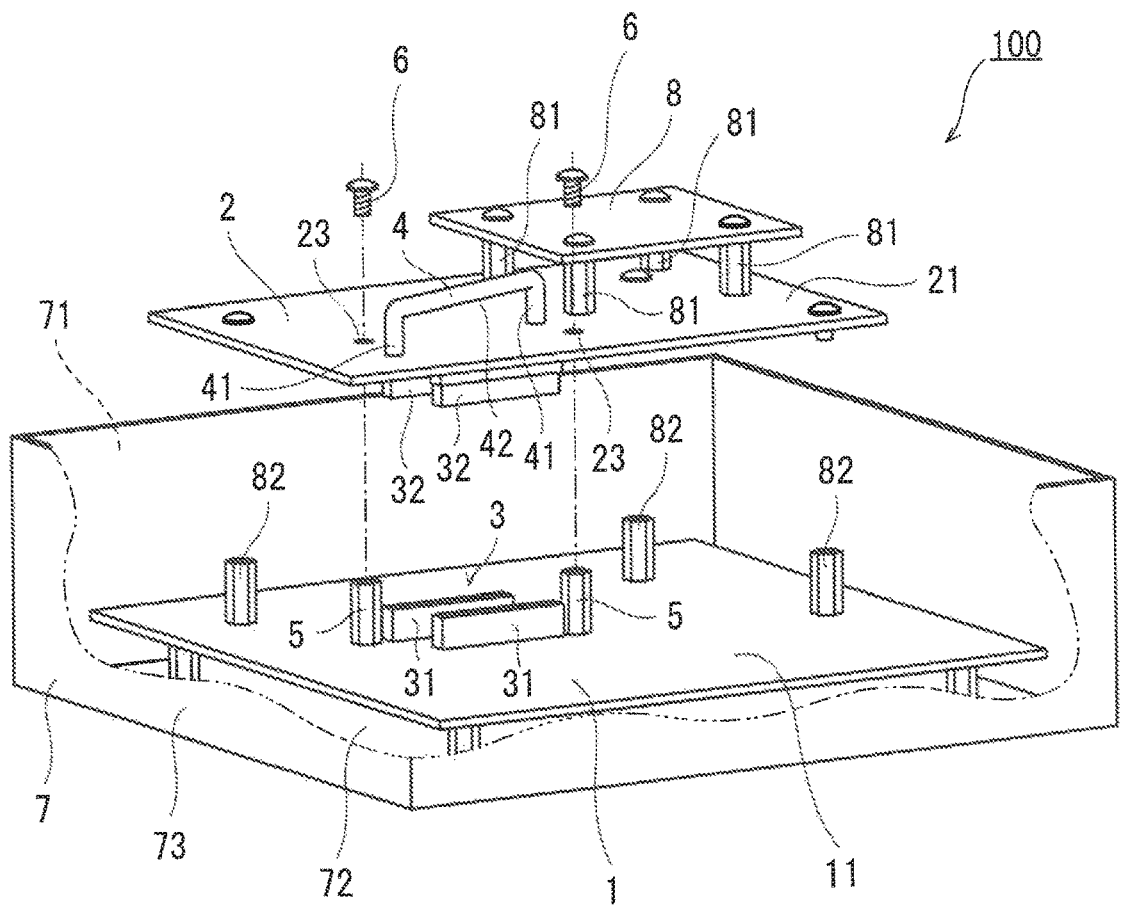
FIG. 1 is an exploded perspective view showing an exemplary configuration of a robot controller according to an embodiment of the present invention.

FIG. 1 is an exploded perspective view showing an exemplary configuration of a robot controller 100 according to an embodiment of the present invention.

The robot controller 100 is an electronic device that controls the operation of an unillustrated robot.

As shown in FIG. 1, the robot controller 100 includes a first board 1, a second board 2, a third board 8, a board-to-board connector 3, a grip member 4, a pair of spacers 5, a pair of male screws 6, and a housing 7.

The first board 1 is a printed circuit board having an electronic circuit component mounted thereon. The first board 1 receives current command values, based on which the first board 1 controls currents to be supplied to servomotors provided at joints of the robot. The pattern of the first board 1 is designed to carry relatively high-current, high-voltage electricity to be supplied to the servomotors provided at the joints of the robot. The first board 1 is disposed on and parallel to a later-described bottom plate 72 of the housing 7. However, this configuration is not limiting. For example, the first board 1 may be disposed on and perpendicular to the later-described bottom plate 72 of the housing 7 (i.e., the first board 1 may be placed upright on the bottom plate 72).

The second board 2 is a printed circuit board having an electronic circuit component mounted thereon. The second board 2 is a board provided separately from the first board 1. When the boards 1 and 2 are assembled, the second board 2 is stacked to the first board 1 and located outward of (above) a front side 11 of the first board 1. In the present embodiment, the second board 2 is stacked above the first board 1 disposed parallel to the bottom plate 72. However, this configuration is not limiting. In the case where the first board 1 is placed upright on the bottom plate 72, the second board 2 may be stacked lateral to the first board 1. The circuit of the second board 2 generates current command values based on specified target positions of the joints. The pattern of the second board 2 is designed to carry lower-current, lower-voltage electricity than the pattern of the first board 1. Configuring the first board 1 and the second board 2 as separate boards therefore allows effective prevention of short-circuiting between the circuit of the first board 1 and the circuit of the second board 2. Additionally, since the first board 1 and the second board 2 are configured as separate boards, a safety approval by an approving authority for a device of the first board 1 and a safety approval by the approving authority for a device of the second board 2 can be separately obtained. Thus, when the specification of one of the devices is changed, the need for obtaining a safety approval for the other device again is eliminated.

The second board 2 has a pair of through holes 23 formed at locations where the tip ends (upper ends) of the pair of spacers 5 descried later make contact with the second board 2. The pair of through holes 23 have a diameter that allows insertion of the male screws 6 described later into the through holes 23.

The third board 8 is a printed circuit board having an electronic circuit component mounted thereon. The third board 8 is a board provided separately from the first and second boards 1 and 2. The third board 8 is stacked to the first and second boards 1 and 2 and located above the second board 2. The third board 8 generates the target positions of the joints based on an operation program. In the present embodiment, the third board 8 is so configured that the third board 8 having been fixed to the second board 2 via a plurality of spacers 81 is joined to the first board 1. Specifically, each of the spacers 81 has a base end (lower end) screwed to the second board 2 and a tip end (upper end) screwed to the third board 8.

As described above, the robot controller 100 uses the third board 8 to generate and output the target positions based on the operation program. The outputted target positions are inputted to the second board 2 via the board-to-board connector 3. Subsequently, the second board 2 generates and outputs current command values for the joints based on the inputted target positions of the joints. The outputted current command values are inputted to the first board 1 via the board-to-board connector 3. The first board 1 then supplies currents to the joints based on the inputted current command values for the joints.

Figure 2:
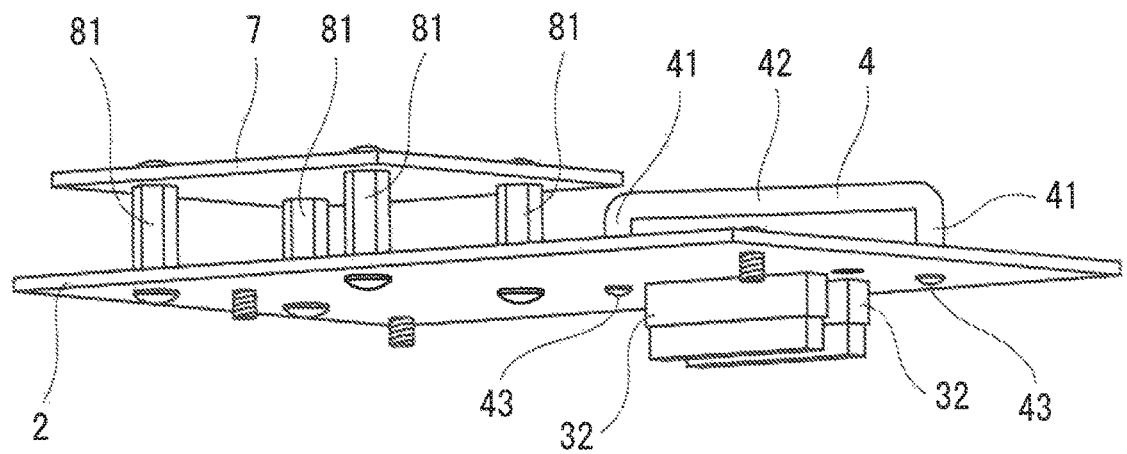
FIG. 2 is a perspective view showing exemplary configurations of a second board and a third board of the robot controller of FIG. 1.

FIG. 2 is a perspective view showing exemplary configurations of the second board 2 and third board 8.

As shown in FIGS. 1 and 2, the board-to-board connector 3 electrically connects the first board 1 and the second board 2 and, for example, allows the current command values for the joints to be outputted from the second board 2 to the first board 1. In the present embodiment, a pair of board-to-board connectors 3 are provided.

Each board-to-board connector 3 includes a first terminal 31 provided on the first board 1 and a second terminal 32 provided on the second board 2, the second terminal 32 being configured to be connected to the first terminal 31. The first terminal 31 is provided, for example, on the front side 11 of the first board 1, and the second terminal 32 is provided, for example, on a back side 22 of the second board 2. In the board-to-board connector 3, for example, the second terminal 32 is a male terminal having a plurality of pins (electrical contact portion) extending in the direction in which the first and second boards 1 and 2 are stacked, namely in the direction from the back side 22 of the second board 2 toward the first board 1 (downward direction), while the first terminal 31 is a female terminal having a pin socket (electrical contact portion) configured to receive the second terminal 32 fitted therein and make contact with the plurality of pins of the second terminal 32. Thus, the second terminal 32 is inserted into and connected to the first terminal 31 by lowering the second board 2 in the direction in which the first and second boards 1 and 2 are stacked, and the second terminal 32 is withdrawn and disconnected from the first terminal 31 by lifting the second board 2 in the direction in which the first board 1 and the second board 2 are stacked. In the present embodiment, as described above, a pair of board-to-board connectors 3 are provided, and the pair of board-to-board connectors 3 include a pair of first terminals 31 and a pair of second terminals 32. The pair of first terminals 31 are mounted parallel to each other on the front side 11 of the first board 1, and accordingly the pair of second terminals 32 are mounted parallel to each other on the back side 22 of the second board 2.

Figure 3:
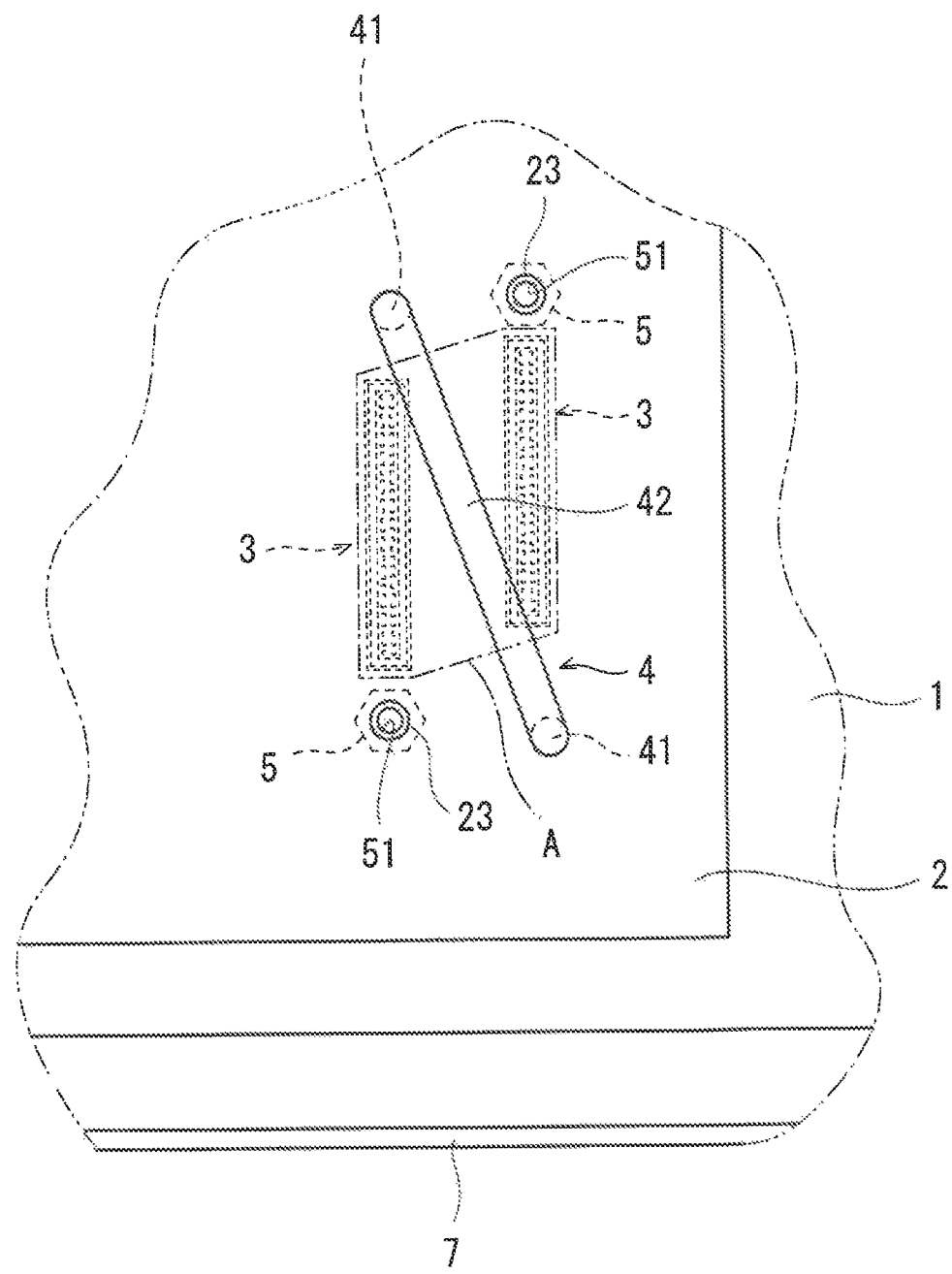
FIG. 3 is an enlarged plan view showing key components in an exemplary configuration of the robot controller of FIG. 1.

FIG. 3 is an enlarged view showing key components in an exemplary configuration of the robot controller 100.

The grip member 4 is, for example, a handle-like member provided on the second board 2 and is formed in a shape adapted for gripping by a hand of an operator performing the operation of assembling the boards or the operation of inspecting the interior of the robot controller 100. The grip member 4 is provided on a front side 21 of the second board 2 and located in the vicinity of the second terminals 32. The grip member 4 includes, for example, a pair of connection portions 41 disposed on and extending from the front side 21 of the second board 2 and a grip portion 42 connecting the tip ends (upper ends) of the pair of connection portions 41 to each other. The grip portion 42 is a portion to be gripped by the operator performing the assembly operation. As shown in FIG. 3, the grip portion 42 as viewed in the direction of the normal to the first board 1 extends through a region A in which the board-to-board connectors 3 are located. In the present embodiment, the region A encloses the pair of board-to-board connectors 3. That is, when the grip portion 42 and the region A are projected onto a projection plane parallel to the first and second boards 1 and 2, the grip portion 42 extends through the region A in the projection plane.

Unillustrated female threads are formed at the base ends (lower ends) of the pair of connection portions 41 of the grip member 4. A pair of unillustrated through holes are formed at locations where the pair of connection portions 41 of the grip member 4 and the front side 21 of the second board 2 make contact. A pair of male screws 43 shown in FIG. 2 are inserted in the through holes from the back side 22 of the second board 2 toward the front side 21 of the second board 2 and are screwed into the female threads of the pair of connection portions 41 of the grip member 4. In this manner, the grip member 4 is attached to the second board 2.

As shown in FIG. 1, the pair of spacers 5 are disposed on and extend from either the front side 11 of the first board 1 or the back side 22 of the second board 2, and are located in the vicinity of the board-to-board connectors 3. In the present embodiment, the pair of spacers 5 are disposed on and extend from the first board 1. For example, the base ends (lower ends) of the pair of spacers 5 are screwed to the first board 1.

Each of the pair of spacers 5 has a length such that when the first terminal 31 and the second terminal 32 are connected, the base end of the spacer 5 is in contact with the front side 11I of the first board 1, and the tip end (upper end) of the spacer 5 is in contact with the back side 22 of the second board 2.

The pair of spacers 5 have female threads 51 formed at their respective tip ends. The pair of spacers 5 as viewed in the direction of the normal to the second board 2 are arranged coaxially with the pair of through holes 23 of the second board 2. The pair of female threads 51 are engaged with the pair of male screws 6 inserted into the pair of through holes 23 from the front side 21 of the second board 2 toward the back side 22 of the second board 2. Thus, the second board 2 can be fixed to the first board 1.

Additionally, a plurality of spacers 82, which, for example, have the same shape as the spacers 5, are disposed on and extend from the first board 1. These spacers 82 have base ends (lower ends) screwed to the first board 1 and tip ends (upper ends) screwed to the second board 2. Thus, the first board 1, the second board 2, and the third board 8 are spaced apart in the stacking direction, so that, for example, the influence of noise among the boards is reduced.

The housing 7 is box-shaped, and includes an opening 71 formed in the top surface thereof, a bottom plate 72, a side wall 73, and an unillustrated lid closing the opening 71. The opening 71 has a size that allows placement of the first and second boards 1 and 2 into the housing 7 through the opening 71, and the opening 71 is located outward of (above) the front side 21 of the second board 2. The first and second boards 1 and 2 are assembled by being stacked above and parallel to the bottom plate 72. The first board 1 is disposed above and fixed to the bottom plate 72 via unillustrated spacers. The housing 7 of the robot controller 100 is so configured that the housing 7 may be vertically placed instead of being horizontally placed as shown in FIG. 1. That is, the housing 7 of the robot controller 100 is so configured that the housing 7 may be placed in a position where any one of the four surfaces constituting the side wall 73 faces downward with the bottom plate 72 vertically extending.

As described above, the first and second boards 1 and 2 are assembled by being stacked above and parallel to the bottom plate 72. Thus, the boards can be joined to the housing 7 by stacking the boards in the operation of assembling the boards. This facilitates the operation of assembling the boards and offers an advantage, for example, in automating the assembly operation by means of a robot.

[Example of Assembly Operation]

Next, an example of the operation of assembling the boards of the robot controller 100 will be described.

Figure 4:
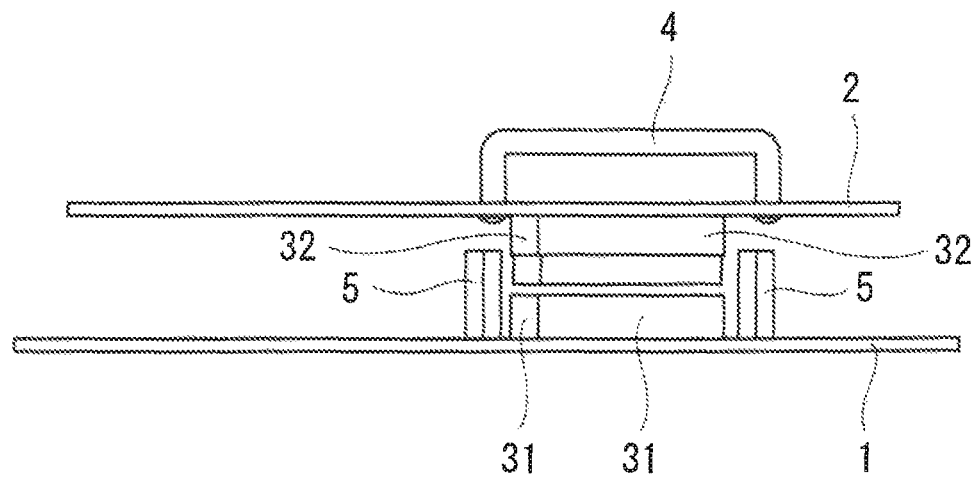
FIG. 4 illustrates an example of the operation of assembling the boards of the robot controller of FIG. 1.
Figure 5:
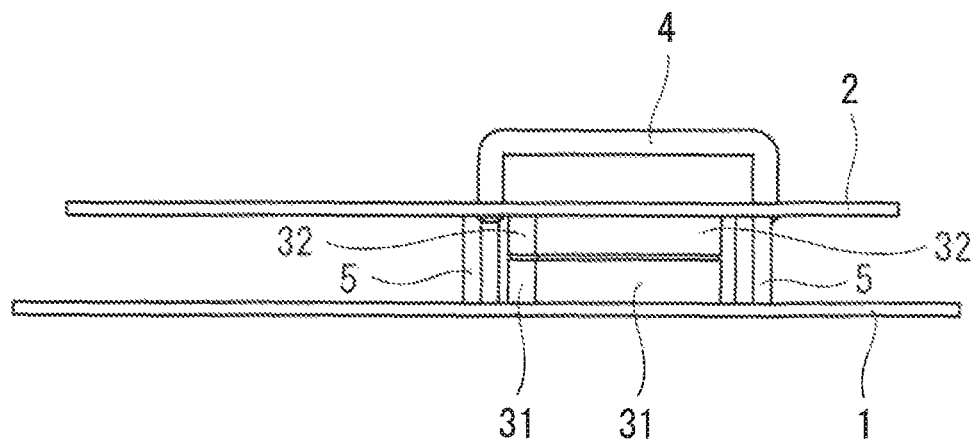
FIG. 5 illustrates an example of the operation of assembling the boards of the robot controller of FIG. 1.

FIGS. 4 and 5 illustrate an example of the operation of assembling the boards of the robot controller 100.

When mounting the second and third boards 2 and 8 to construct the robot controller 100, the operator performing the assembly operation holds the grip portion 42 of the grip member 4 and places the second and third boards 2 and 8 into the interior space of the housing 7 through the opening 71 of the housing 7. The operator roughly estimates the location where the second and third boards 2 and 8 should be mounted, and places the second and third boards 2 and 8 at the location.

Subsequently, the operator manipulates the grip member 4 while looking through the pair of through holes 23 at regions below the through holes 23 (in the direction from the second board 2 toward the first board 1) and places the second and third boards 2 and 8 in such a manner that the pair of through holes 23 and the pair of female threads 51 are coaxially arranged as shown in FIG. 3.

Subsequently, the operator manipulates the grip member 4 to lower the second and third boards 2 and 8 (bring the second and third boards 2 and 8 close to the first board 1) as shown in FIG. 4 while maintaining the coaxiality of the pair of through holes 23 and the pair of female threads 51. Thus, the pair of second terminals 32 are inserted into the pair of first terminals 31, and the first board 1 and the second board 2 are connected by the board-to-board connectors 3. Finally, the male screws 6 are screwed into the female threads 51 of the spacers 5 to fix the second and third boards 2 and 8 to the first board 1. In this manner, the second and third boards 2 and 8 can be joined to the first board 1.

When removing the second and third boards 2 and 8 from the first board 1, the operator removes the pair of male screws 6, holds the grip member 4 and lifts the second and third boards 2 and 8. Thus, the second terminals 32 are withdrawn from the first terminals 31, and the connection via the board-to-board connectors 3 is broken.

In the robot controller 100 of the present embodiment, as described above, the second board 2 can be connected to the first board 1 via the board-to-board connectors 3 by lowering the second and third boards 2 and 8. This can eliminate the need for an additional operation such as connecting the boards by a harness, making it possible to easily and quickly accomplish the operation of assembling the boards.

Additionally, since the operation of making a connection via the board-to-board connectors 3 and the operation of breaking the connection can be performed while gripping the grip member 4, the second board 2 can be prevented from being bent and damaged when the second board 2 is pushed downward to insert the second terminals 32 into the first terminals 31 or the second board 2 is lifted upward to withdraw the second terminals 32 from the first terminals 31. Further, the operator performing the operations can be prevented from directly touching the boards and thereby causing electrostatic breakdown of the electronic circuit components.

Additionally, since the grip portion 42 of the grip member 4, as viewed in the direction of the normal to the first board 1, extends through the region A in which the board-to-board connectors 3 are located, the force applied by pushing the grip member 4 downward can be efficiently transmitted as a force acting to insert the second terminals 32 into the first terminals 31 when the connection via the board-to-board connectors 3 is made. Further, when the connection via the board-to-board connector 3 is broken, the force applied by pulling the grip member 4 upward can be efficiently transmitted as a force acting to withdraw the second terminals 32 from the first terminals 31.

When the first terminals 31 and the second terminals 32 of the board-to-board connectors 3 are connected, the second board 2 can be accurately and easily positioned relative to the first board 1 by making an adjustment such that the pair of through holes 23 and the pair of female threads 51 are coaxially arranged. Thus, even in the case where the first terminals 31 and the second terminals 32 are difficult to look at from a lateral side of a space between the first board 1 and the second board 2, the first terminals 31 and the second terminals 32 can be easily and reliably connected.

Once the upper end of the spacer 5 and the back side 22 of the second board 2 come into contact as shown in FIG. 5, the movement of the second and third boards 2 and 8 in the downward direction (the direction from the second board 2 toward the first board 1) is restricted. Thus, the depth of insertion of the second terminal 32 into the first terminal 31 can be appropriately defined by the spacer 5. This can prevent the second terminal 32 from being inserted so deep into the first terminal 31 that an unnecessarily large force is applied to the first and second terminals 31 and 32 and causes damage to the first and second terminals 31 and 32. In particular, by virtue of the provision of the pair of spacers 5, the depth of insertion of the second terminals 32 into the first terminals 31 can be more appropriately defined by the pair of spacers 5.

Another Embodiment

Figure 6:
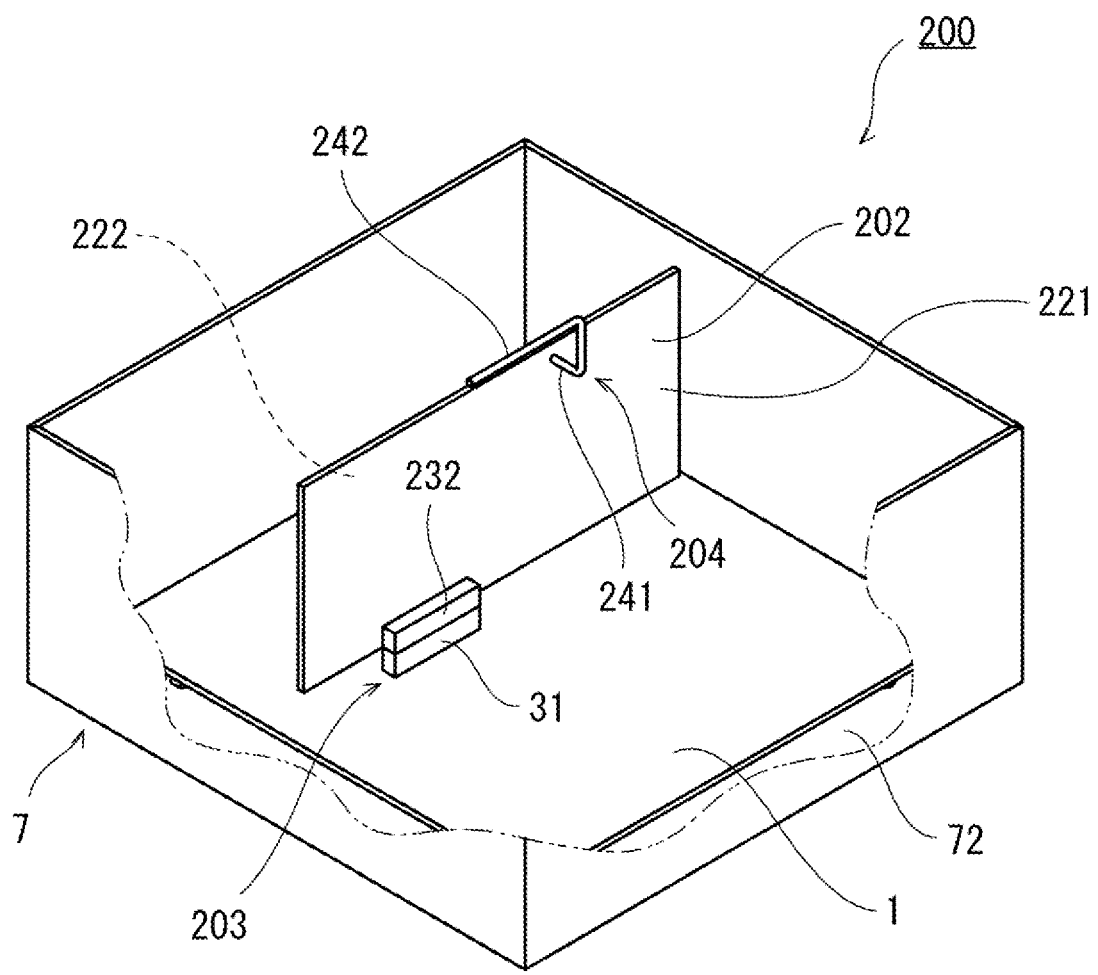
FIG. 6 is a perspective view showing an exemplary configuration of a robot controller according to another embodiment of the present invention.

FIG. 6 is a perspective view showing an exemplary configuration of a robot controller 200 according to another embodiment of the present invention.

In the present embodiment, as shown in FIG. 6, a second board 202 is located above the first board 1 and placed in such a position as to intersect (in particular, perpendicularly intersect) the first board 1. The other features of the second board 202 are the same as those of the second board 2 and will therefore not be described in detail.

A board-to-board connector 203 has a second terminal 232 extending in a direction toward the first board 1 from a portion of the periphery of either a front side 221 or a back side 222 of the second board 202, the portion facing the first board 1. The other features of the board-to-board connector 203 are the same as those of the board-to-board connector 3 and will therefore not be described in detail.

A grip member 204 includes a connection portion 241 disposed on and extending from the front side 221 of the second board 202 and a grip portion 242 extending from the tip end of the connection portion 241. The connection portion 241 is curved at its central portion to have an L-shape. The part of the connection portion 241 that is closer to the base end than is the curved portion extends in a direction orthogonal to the second board 202, while the part that is closer to the tip end than is the curved portion extends in a direction orthogonal to the first board 1. The grip portion 242 extends parallel to the first board 1 and the second board 2. The other features of the grip member 204 are the same as those of the grip member 4 and will therefore not be described in detail.

Many modifications and other embodiments of the present invention will be apparent to those skilled in the art from the foregoing description. Accordingly, the foregoing description is to be construed as illustrative only, and is provided for the purpose of teaching those skilled in the art the best mode for carrying out the invention. The details of the structure and/or function may be varied substantially without departing from the scope of the invention.

REFERENCE SIGNS LIST

1 First board
2 Second board
3 Board-to-board connector
4 Grip member
31 First terminal (of board-to-board connector)
32 Second terminal (of board-to-board connector)
100 Robot controller

The invention claimed is:

1. An electronic device comprising:
a first board configured as a printed circuit board having an electronic circuit component mounted thereon;
a second board configured as a printed circuit board having an electronic circuit component mounted thereon;
a board-to-board connector configured to electrically connect the first board and the second board, the board-to-board connector comprising a first terminal provided on the first board and a second terminal provided on the second board, the second terminal being configured to be connected to the first terminal; and
a grip member provided on the second board, the grip member including:
(i) a pair of connection portions disposed on and extending from a front side of the second board, and
(ii) a grip portion connecting upper ends of the pair of connection portions to each other such that the grip portion, as viewed in a direction of a normal to the first board, extends through a region in which the board-to-board connector is located.

2. The electronic device according to claim 1, wherein the second board is stacked to the first board,
the first terminal is provided on a front side of the first board,
the second terminal is provided on a back side of the second board.

3. The electronic device according to claim 2, wherein one of the first and second terminals of the board-to-board connector is a male terminal having an electrical contact portion extending in a direction in which the first and second boards are stacked, and
the other of the first and second terminals is a female terminal having an electrical contact portion configured to receive the male terminal fitted therein and make contact with the electrical contact portion of the male terminal.

4. The electronic device according to claim 2, further comprising a spacer disposed on and extending from either the front side of the first board or the back side of the second board, the spacer having a length such that when the first terminal and the second terminal are connected, one end of the spacer is in contact with the front side of the first board and the other end of the spacer is in contact with the back side of the second board.

5. The electronic device according to claim 4, comprising a pair of the spacers.

6. The electronic device according to claim 5, wherein the pair of spacers are provided on the first board, and
the second board has a pair of through holes at locations where the other ends of the pair of spacers make contact with the second board.

7. The electronic device according to claim 6, wherein a female thread is formed in the other end of each of the spacers, and
the electronic device further comprises a pair of male screws inserted through the pair of through holes and screwed into the female threads of the pair of spacers.

8. The electronic device according to claim 1, further comprising a housing having an opening, wherein
the opening has a size that allows placement of the first and second boards into the housing through the opening, and
the opening is located outward of the front side of the second board.

9. A robot controller comprising:
a first board configured as a printed circuit board having an electronic circuit component mounted thereon;
a second board configured as a printed circuit board having an electronic circuit component mounted thereon;
a board-to-board connector configured to electrically connect the first board and the second board, the board-to-board connector including a first terminal provided on the first board and a second terminal provided on the second board, the second terminal being configured to connect to the first terminal; and
a grip member provided on the second board, the grip member including:
(i) a pair of connection portions disposed on and extending from a front side of the second board, and
(ii) a grip portion connecting upper ends of the pair of connection portions to each other such that the grip portion, as viewed in a direction of a normal to the first board, extends through a region in which the board-to-board connector is located.

* * * * *